United States Patent
Fautz

(10) Patent No.: US 10,429,474 B2
(45) Date of Patent: Oct. 1, 2019

(54) MAGNETIC RESONANCE IMAGING METHOD AND APPARATUS

(71) Applicant: Siemens Aktiengesellschaft, Munich (DE)

(72) Inventor: Hans-Peter Fautz, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 1289 days.

(21) Appl. No.: 14/326,661

(22) Filed: Jul. 9, 2014

(65) Prior Publication Data
US 2015/0019172 A1   Jan. 15, 2015

(30) Foreign Application Priority Data
Jul. 9, 2013   (DE) .................... 10 2013 213 376

(51) Int. Cl.
| | | |
|---|---|---|
| *G01R 33/56* | (2006.01) | |
| *G01R 33/565* | (2006.01) | |
| *G01R 33/3415* | (2006.01) | |

(52) U.S. Cl.
CPC ..... *G01R 33/5608* (2013.01); *G01R 33/5659* (2013.01); *G01R 33/3415* (2013.01); *G01R 33/56563* (2013.01)

(58) Field of Classification Search
CPC ...................................................... G01R 33/56
(Continued)

(56) References Cited

U.S. PATENT DOCUMENTS

| | | |
|---|---|---|
| 5,633,585 A | 5/1997 | Kuhn |
| 7,692,425 B2 | 4/2010 | Brau et al. |

(Continued)

OTHER PUBLICATIONS

"Validation of Transmit SENSE with Reciprocity," Zhang et al., Proc. Intl. Soc. Mag. Reson. Med., vol. 13 (2005) p. 2434.
(Continued)

*Primary Examiner* — Michael J Dalbo
(74) *Attorney, Agent, or Firm* — Schiff Hardin LLP

(57) ABSTRACT

A magnetic resonance (MR) tomography apparatus has an array composed of a number n of single coils $E_i$ to acquire reception signals $I_i$. The tomography apparatus is operated by a method that includes the following steps. For each single coil $E_i$, a processor determines, or is provided with, an individual reception sensitivity profile in positional space r $B1_i^-(r)$. An examination subject introduced into the MR tomography apparatus is scanned to acquire reception signals $I_i(k)$ in the frequency domain with the n reception coils $E_i$. Fourier-transformed signals $IF_i(r)$ are determined from the reception signals $I_i(k)$. Complexly corrected signals $\tilde{IF}_i(r)$ are determined on the basis of the signals $IF_i(r)$ and the individual reception sensitivity profiles $B1_i^-(r)$. A sum signal $MR(r)$ is determined by complex addition of the corrected signals $\tilde{IF}_i(r)$. Image data of the examination subject are reconstructed on the basis of the sum signal $MR(r)$.

9 Claims, 2 Drawing Sheets

(58) Field of Classification Search
USPC .......... 702/19, 179, 183, 189, 194; 324/309
See application file for complete search history.

(56) References Cited

U.S. PATENT DOCUMENTS

| | | | | |
|---|---|---|---|---|
| 2003/0069495 | A1* | 4/2003 | Agrikola | G01R 33/56 |
| | | | | 600/410 |
| 2005/0258830 | A1* | 11/2005 | Deimling | G01R 33/5613 |
| | | | | 324/309 |
| 2006/0287596 | A1* | 12/2006 | Johnson | A61B 5/4312 |
| | | | | 600/437 |
| 2014/0266198 | A1* | 9/2014 | Tadic | G01R 33/387 |
| | | | | 324/309 |

OTHER PUBLICATIONS

"Computation of Transmitted and Received B1 Fields in Magnetic Resonance Imaging," Milles et al., IEEE Trans. on Biomedical Engineering, vol. 53, No. 5 (2006) pp. 885-895.

\* cited by examiner

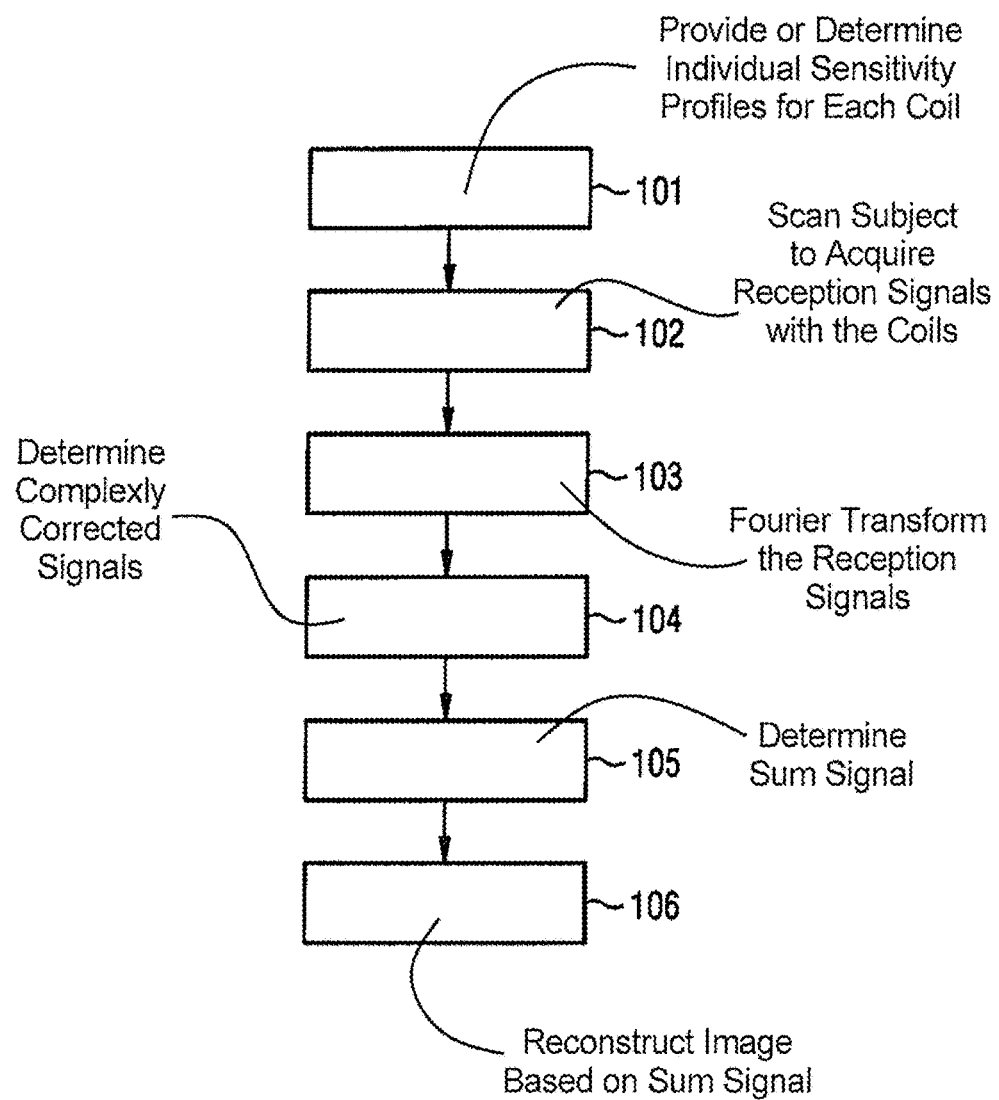

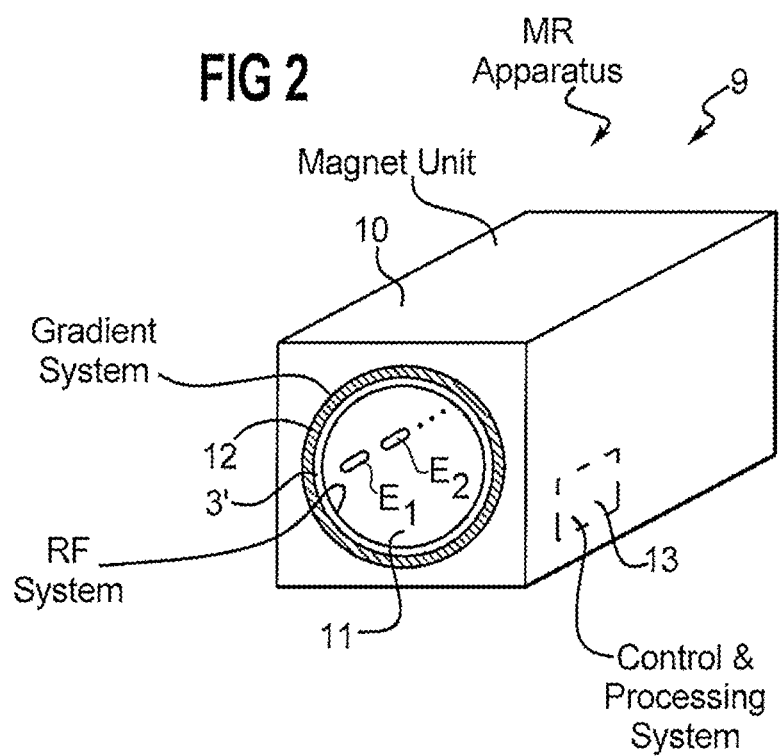

MAGNETIC RESONANCE IMAGING METHOD AND APPARATUS

BACKGROUND OF THE INVENTION

Field of the Invention

The present invention concerns a method for magnetic resonance (MR) imaging, in particular for medical applications, as well as an MR tomography apparatus for implementing such a method.

Description of the Prior Art

It is known for an MR tomography apparatus to have an array composed of a number n of single coils $E_i$ to receive reception signals $I_i$. "MR" stands for "nuclear magnetic resonance", the discovery of which is ascribed to Bloch and Purcell in 1946. An "MR tomography" apparatus executes methods for slice imaging magnetic resonance tomography ("magnetic resonance imaging", MRI).

In general, reception coils optimized for the anatomy of an examination subject who is to be examined are used to receive MR signals generated in an MR tomography apparatus. The optimization typically takes place with regard to the resulting signal-to-noise ratio (SNR) and the capability for parallel imaging. In addition to volume coils, surface coils are used in modern MR tomography systems.

Surface coils are almost always used solely as reception coils in MR tomography, and are particularly suited to depict surface-proximate structures due to their flexible structure and small coil diameters. A volume coil integrated into the MR tomography apparatus typically acts as a transmitter. With a suitable design of the reception coils, a high signal-to-noise ratio SNR can be achieved near the coil. A disadvantage in the use of a surface coil is its small penetration depth or measurement depth, a reduced measurement field (field of view), and an inhomogeneous exposure of the image since the sensitivity of the coil decreases with increasing distance from the coil.

Modern MR tomography systems allow the subsequent correction of the intensity decline in the image using knowledge of the sensitivity profiles of the coils that are used.

A known variant depicts the combination of multiple surface coils into a coil array. A SNR gain over a larger region can be realized via the combination of multiple surface coils. Furthermore, coil arrays are a requirement for parallel imaging.

The design of such coil arrays utilizes the better SNR of smaller coils, such that a markedly better spatial resolution and/or time resolution is possible with a coil array comprising smaller single coils, as well as a larger field of view (FOV) via the simultaneous use of a multitude of these single coils. The single coils receive the MR signal of a single excitation simultaneously and independently of one another, meaning that the MR signal is acquired via independent reception channels (one coil=one channel).

A problem in this approach is that the spatial sensitivity profiles of surface reception coil arrays lead to an unintentional, spatially variable signal-to-noise ratio in the reconstructed MR image. The image intensity in proximity to the reception coil is typically increased; the image intensity then decreases with distance from the coil toward the inside of the body. The effect is more strongly pronounced the smaller the individual single coils, i.e. the larger the number of single coils in the coil array. The effect also tends to increase with increasing field strength since the reception profiles are spatially more localized.

The computational combination of the MR reception signals from the individual reception channels during the image reconstruction poses an additional problem. A phase-coherent complex addition of the signals of the different reception coils in principle offers the best signal-to-noise ratio, but if the signals are not complexly added, this can lead to spatially different signal reduction.

The problems cited in the preceding are typically handled independently of one another.

A correction of the sensitivity amplitudes is typically implemented by means of a "prescan normalize" method. Within the scope of a reference measurement, an examination subject is scanned with low resolution using two coils: a local coil array whose sensitivity profile should be corrected, and a volume coil, which is assumed to have a spatially constant sensitivity profile. MR images are respectively reconstructed from the measurement values acquired by the coil array and by the volume coil. The relationship of the two images, i.e. the respective image values, yields a spatial correction map. This approach cannot be used with current high-field apparatuses, however, because in such apparatuses a volume coil with a homogeneous reception sensitivity is not present.

Measurement signals of reception coil elements are typically combined by calculating the square of the absolute value thereof, which prevents signal cancellations but does not deliver an optimal SNR. A version known as "adaptive combine" offers an image-based method.

SUMMARY OF THE INVENTION

An object of the invention is to provide an imaging method for a MR tomography, that achieves an improved sensitivity correction for reception coils (and therefore an optimized signal-to-noise ratio). It is also an object of the invention to provide an MR apparatus that implements such a method.

The method according to the invention for imaging with an MR tomography apparatus that has an array of a number n of single coils $E_i$ to acquire reception signals $I_i$, with i=1, . . . , n—includes the following steps.

In a first step, an individual reception sensitivity profile in the spatial domain with spatial coordinates r $B1_i^-(r)$:

$$B1_i^-(r)=|a_i(r)|*e^{i\cdot\varphi_i(r)} \qquad (1)$$

with amplitude $a_i(r)$ and phase $\varphi_i(r)$ is predetermined or determined for each single coil $E_i$. The individual reception sensitivity profiles $B1_i^-(r)$ are preferably determined on the basis of a "SENSE" imaging or a "B1 mapping" imaging with the MR tomography apparatus. Refer to the prior art with regard to implementation of "SENSE" imaging and "B1 mapping" imaging.

In a second step, a scanning of an examination subject introduced into the MR apparatus to acquire reception signals $I_i(k)$ in frequency space with wave number k takes place using the n reception coils $E_i$. This step corresponds to the normal acquisition of MR data in an MR examination of an examination subject (a person, for example).

In a third step, a determination of Fourier-transformed signals $IF_i(r)$ from the reception signals $I_i(k)$ takes place, wherein, for the Fourier-transformed signals $IF_i(r)$:

$$IF_i(r)=\rho(r)\cdot e^{i\Phi(r)}\cdot B1_i^-(r)+N \qquad (2)$$

with N:=noise term, $\rho(r)\cdot e^{i\Phi(r)}$:=proton density.

In a fourth step, a determination of complexly corrected signals $\tilde{IF}_i(r)$ takes place on the basis of the signals $IF_i(r)$ and the individual reception sensitivity profiles $B1_i^-(r)$. In one development, both the amplitudes and the phases of the signals $I_i(r)$ are corrected in the determination of the complexly corrected signals ĨF$_i$(r). In an alternative embodiment, only the amplitudes of the signals I$_i$(r) of the signals I$_i$[sic] are corrected in the determination of the complexly corrected signals ĨF$_i$(r). In an alternative embodiment, only the phases of the signals I$_i$(r) are corrected in the determination of the complexly corrected signals ĨF$_i$(r).

In a preferred embodiment, the determination of the complexly corrected signals ĨF$_i$(r) takes place according to:

$$\tilde{IF}_i(r) = \frac{IF_i(r)}{B1_i(r)} \text{ and} \quad (4)$$

$$\tilde{IF}_i(r) = \frac{\rho(r) \cdot e^{i\phi(r)} \cdot |a_i(r)|e^{i\varphi_i(r)} + N}{|a_i(r)|e^{i\varphi_i(r)}}. \quad (5)$$

In a fifth step, a determination of a sum signal MR(r) takes place by complex addition of the corrected signals ĨF$_i$(r):

$$MR(r) = \sum_i \tilde{IF}_i(r). \quad (3)$$

In a sixth step, a reconstruction of image data of the examination subject takes place on the basis of the sum signal MR(r).

The correction of the signals thus takes place individually for each reception channel, or each reception coil, before the sum signal MR(r) is calculated. Naturally, additional corrections (phase correction, amplitude correction or both) can subsequently be executed on the basis of the sum signal MR(r).

Analogous to a "prescan normalize" method, the method according to the invention provides to determine the reception sensitivities B1$_i^-$(r) via a calibration measurement. In contrast to the "prescan normalize" method, the reception sensitivities B1$_i^-$(r) of the individual channels and their amplitudes and relative phases are determined. Methods thus can be used as they are used for SENSE imaging, for example. In particular for systems with parallel transmission, the reception sensitivities B1$_i^-$(r) can also be obtained from measurements that determine the transmit sensitivities, i.e. also from known B1 mapping methods.

The reception sensitivity profiles B1$_i^-$(r) are provided during the image reconstruction, and the reception signals I$_i$(k) are corrected accordingly.

The proposed complex correction of the individual reception signals I$_i$(k) allows the direct complex addition of the signals from the different single coils E$_1$ with optimal SNR.

In an embodiment, the correction is applied after the combination of the individual reception signals I$_i$(k) or IF$_i$(r) from the individual single coils E$_1$ in order to reduce the error rate of the correction, for example. The individual reception sensitivity profiles B1$_i^-$(r) must be combined in the same manner as the signals are constructed for image reconstruction.

The correction can be implemented at any time in the frequency domain or in the spatial domain.

The method in accordance with the invention enables a sensitivity correction without a reference coil (for example a volume coil). The method is therefore useable in high-field systems.

The method according to the invention is furthermore also suitable for transmitter arrays, among other things. The determination of the reception sensitivities can take place from the measurement (data acquisition) that is necessary for the B1 mapping method. The repeated measurements of the different B1 maps then allows a more precise determination of the reception sensitivities as well.

In a further embodiment of the method, the individual reception sensitivity profiles B1$_i^-$(r) are provided or determined as relative reception sensitivities S$_i^{rel}$, and the complexly corrected signals ĨF$_i$(r) are determined on the basis of the relative signals IF$_i$(r), which makes the method more error-tolerant.

The present invention also encompasses a processor that is programmed to implement the method described above.

The present invention also encompasses a magnetic resonance tomography apparatus that is designed to implement the method described above.

The present invention also encompasses a non-transitory, computer-readable data storage medium encoded with programming instructions that, when the storage medium is loaded into a computerized control and processing system of a magnetic resonance tomography apparatus, that has an array composed of a number of individual RF coils, cause the control and processing system to operate the MR tomography apparatus in accordance with any or all of the above-described embodiments of the method according to the invention.

The invention also encompasses an MR tomography apparatus with an array composed of a number n of single coils E$_i$ to acquire reception signals I$_i$, with i=1, ..., n.

The MR tomography apparatus has a computerized processor that is configured to determine or receive an individual reception sensitivity profile B1$_i^-$(r) in the spatial domain with spatial coordinate r for each single coil E$_i$:

$$B1_i^-(r) = |a_i(r)| * e^{i\bullet\varphi_i(r)} \quad (1)$$

with amplitude a$_i$(r) and phase φ$_i$(r). The processor is configured to produce Fourier transforms IF$_i$(r) of the reception signals I$_i$(k) in the frequency domain with wave number k, which have been generated by scanning (acquiring MR data from) (with the n reception coils E$_i$) an examination subject introduced into the MR tomography apparatus, wherein:

$$IF_i(r) = \rho(r) \cdot e^{i\Phi(r)} \cdot B1_i^-(r) + N \quad (2)$$

with noise N, proton density ρ(r)·e$^{i\Phi(r)}$. The processor is furthermore configured to determine complexly corrected signals ĨF$_i$(r) on the basis of the signals IF$_i$(r) and the individual reception sensitivity profiles B1$_i^-$(r). The processor is configured to calculate a sum signal MR(r) by complex addition of the corrected signals Ĩ$_i$(r):

$$MR(r) = \sum_i \tilde{I}_i(r). \quad (3)$$

The processor is configured to reconstruct image data of the examination subject on the basis of the sum signal MR(r).

In an embodiment of the MR tomography apparatus, the processor is configured to determine the complexly corrected signals ĨF$_i$(r), such that the amplitudes and the phases of the signals I$_i$(r) are corrected.

BRIEF DESCRIPTION OF THE DRAWINGS

FIG. 1 is a flowchart of an exemplary embodiment of the method according to the invention.

FIG. 2 schematically illustrates an MR tomography apparatus in accordance with the invention.

DESCRIPTION OF THE PREFERRED EMBODIMENTS

In the example according to FIG. 1, a schematic flowchart is shown of an exemplary embodiment of the method for imaging with an MR tomography apparatus that has an array composed of a number n of single coils $E_i$ to acquire reception signals $I_i$, with i=1, . . . , n. All steps are implemented in a computerized processor, except step 102. In a first step 101, the processor determines, or is provided with, an individual reception sensitivity profile in the spatial domain r $B1_i^-(r)$, for each single coil $E_i$:

$$B1_i^-(r)=|a_i(r)|*e^{i\bullet\varphi_i(r)} \qquad (1)$$

with amplitude $a_i(r)$ and phase $\varphi_i(r)$. In a second step 102, a scan takes place of an examination subject introduced into the MR tomography apparatus to acquire reception signals $I_i(k)$ in the frequency domain with wave number k via the n reception coils $E_i$. In a third step 103, a determination of Fourier-transformed signals $IF_i(r)$ from the reception signals $I_i(k)$ takes place, wherein:

$$IF_i(r)=\rho(r)\cdot e^{i\phi(r)}\cdot B1_i^-(r)+N \qquad (2)$$

with N:=noise term, $\rho(r)\cdot e^{i\phi(r)}$:=proton density. In a fourth step 104, a determination of complexly corrected signals $\tilde{I}F_i(r)$ takes place on the basis of the signals $IF_i(r)$ and the individual reception sensitivity profiles $B1_i^-(r)$. In a fifth step 105, a determination of a sum signal MR(r) takes place by complex addition of the corrected signals $\tilde{I}_i(r)$:

$$MR(r) = \sum_i \tilde{I}_i(r). \qquad (3)$$

A reconstruction of image data of the examination subject takes place in a sixth step 106 on the basis of the sum signal MR(r).

In the present example according to FIG. 2, a schematic design is shown of an exemplary embodiment of the MR tomography apparatus 9 with an RF system 3 having an array composed of a number n of single coils $E_i$ to acquire reception signals $I_i$, with i=1, . . . , n.

As is known, the MR apparatus 9 has a magnet unit 10, in which the aforementioned RF system 3 is situated, together with a gradient system 12. The RF system 3 and the gradient system 12 surround an examination opening 11 and the magnet unit 10, via which a patient (not shown) can be introduced into the magnet unit 10, and thus into the MR tomography apparatus 9.

The operation of the MR tomography apparatus 9 is controlled by a control and processing system 13.

The control and processing system 13 is configured to determine, or receive, an individual reception sensitivity profile $B1_i^-(r)$ in the spatial domain with spatial coordinate r for each single coil $E_i$:

$$B1_i^-(r)=|a_i(r)|*e^{i\bullet\varphi_i(r)} \qquad (1)$$

with amplitude $a_i(r)$ and phase $\varphi_i(r)$. The control and processing system 13 is configured to generate Fourier transforms $IF_i(r)$ of the reception signals $I_i(k)$ on the basis of reception signals $I_i(k)$ in the frequency domain with wave number k, which have been generated by the control and processing system 9 controlling scanning (with the n reception coils $E_i$) of an examination subject introduced into the MR tomography apparatus, wherein:

$$IF_i(r)=\rho(r)\cdot e^{i\phi(r)}\cdot B1_i^-(r)+N, \qquad (2)$$

with noise N, proton density $\rho(r)\cdot e^{i\phi(r)}$. The control and processing system 13 is configured to determine complexly corrected signals $\tilde{I}F_i(r)$ on the basis of the signals $IF_i(r)$ and the individual reception sensitivity profiles $B1_i^-(r)$, and to determine a sum signal MR(r) by complex addition of the corrected signals $\tilde{I}_i(r)$:

$$MR(r) = \sum_i \tilde{I}_i(r). \qquad (3)$$

The control and processing system 13 is configured to reconstruct image data of the examination subject on the basis of the sum signal MR(r).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance (MR) image using an MR tomography apparatus, having an array comprising a number n of single coils $E_i$, in order to acquire reception signals $I_i$, with i=1, . . . , n, respectively with said n single coils said method comprising:

for each single coil $E_i$, determining in a processor or providing a processor with, an individual reception sensitivity profile in the spatial domain r $B1_i^-(r)$:

$$B1_i^-(r)=|a_i(r)|*e^{i\bullet\varphi_i(r)}$$

with amplitude $a_i(r)$ and phase $\varphi_i(r)$;

using the processor to operate the MR tomography apparatus in order to scan an examination subject introduced into the MR tomography apparatus so as to acquire reception signals Ii(k) in the frequency domain with wave number k via the n reception coils $E_i$;

in said processor, determining Fourier-transformed signals IFi(r) from the reception signals Ii(k), wherein:

$$IF_i(r)=\rho(r)\cdot e^{i\phi(r)}\cdot B1_i^-(r)+N$$

with N:=noise term, $\rho(r)\cdot e^{i\phi(r)}$:=proton density;

in said processor, determining complexly corrected signals $\tilde{I}F_i(r)$ on the basis of the signals IFi(r) and the individual reception sensitivity profiles $B1_i^-(r)$;

in said processor, determining a sum signal MR(r) via complex addition of the corrected signals $\tilde{I}F_i(r)$;

$$MR(r) = \sum_i \tilde{I}F_i(r);$$

in said processor, reconstructing image data of the examination subject on the basis of the sum signal MR(r), and making the image data available at an output of the processor as an electronic data file; and at a display monitor in communication with said processor, displaying an image, corresponding to said image data, of the examination subject.

2. A method according to claim 1, comprising:

determining or providing the individual reception sensitivity profiles $B1_i^-(r)$ as relative reception sensitivities $S_i^{rel}$, and determining the complexly corrected signals $\tilde{I}F_i(r)$ are determined on the basis of the relative signals $IF_i(r)$.

3. A method according to claim 1 comprising:
determining the individual reception sensitivity profiles $B1_i^-(r)$ is said processor from SENSE imaging data or B1 mapping data acquired with the MR tomography apparatus.

4. A method according to claim 1 comprising:
correcting the amplitudes and phases of the signals $I_i(r)$ when determining the complexly corrected signals $\tilde{I}F_i(r)$.

5. A method according to claim 1 comprising:
correcting only the amplitudes of the signals $I_i(r)$ when determining the complexly corrected signals $\tilde{I}F_i(r)$.

6. A method according to claim 1 comprising:
correcting only the phases of the signals $I_i(r)$ when determining the complexly corrected signals $\tilde{I}F_i(r)$.

7. A method according to claim 1 comprising:
determination of the complexly corrected signals $\tilde{I}F_i(r)$ according to:

$$\tilde{I}F_i(r) = \frac{IF_i(r)}{B1_i(r)}$$

$$\tilde{I}F_i(r) = \frac{\rho(r) \cdot e^{i\phi(r)} \cdot |a_i(r)| e^{i\varphi_i(r)} + N}{|a_i(r)| e^{i\varphi_i(r)}}.$$

8. A magnetic resonance (MR) tomography apparatus comprising:
an MR data acquisition unit comprising a radio frequency (RF) transmission system comprising a number n of single RF coils $E_i$ with which reception signals $I_i$ are respectively acquired, with $i=1, \ldots, n$;
a processor provided with or configured to determine, for each single coil $E_i$, an individual reception sensitivity profile in the spatial domain r $B1_i^-(r)$:

$$B1_i^-(r) = |a_i(r)| * e^{i \cdot \varphi_i(r)}$$

with amplitude $a_i(r)$ and phase $\varphi_i(r)$;
said processor being configured to operate the MR tomography apparatus to scan an examination subject introduced into the MR tomography apparatus to acquire reception signals $I_i(k)$ in the frequency domain with wave number k via the n reception coils $E_i$;
said processor being configured to determine Fourier-transformed signals $IF_i(r)$ from the reception signals $I_i(k)$, wherein:

$$IF_i(r) = \rho(r) \cdot e^{i\Phi(r)} \cdot B1_i^-(r) + N$$

with N:=noise term, $\rho(r) \cdot e^{i\Phi(r)}$:=proton density;
said processor being configured to determine complexly corrected signals $\tilde{I}F_i(r)$ on the basis of the signals $IF_i(r)$ and the individual reception sensitivity profiles $B1_i^-(r)$;
said processor being configured to determine a sum signal MR(r) via complex addition of the corrected signals $\tilde{I}F_i(r)$:

$$MR(r) = \sum_i \tilde{I}F_i(r);$$

said processor being configured to reconstruct image data of the examination subject on the basis of the sum signal MR(r), and to make the image data available at an output of the processor as an electronic data file;
a display monitor in communication with said processor; and
said processor being configured to display, at said display monitor, an image, corresponding to said image data, of the examination subject.

9. A non-transitory, computer-readable data storage medium encoded with programming instructions, said data storage medium being loaded into a computerized control and processing system of a magnetic resonance (MR) tomography apparatus having an array comprising a number n of single coils $E_i$ operable to respectively acquire reception signals with $i=1, \ldots, n$, said programming instructions causing said control and processing system to:
for each single coil $E_i$, determine or receive an individual reception sensitivity profile in the spatial domain r $B1_i^-(r)$:

$$B1_i^-(r) = |a_i(r)| * e^{i \cdot \varphi_i(r)}$$

with amplitude $a_i(r)$ and phase $\varphi_i(r)$;
operate the MR tomography apparatus to scan an examination subject introduced into the MR tomography apparatus to acquire reception signals $I_i(k)$ in the frequency domain with wave number k via the n reception coils $E_i$;
determine Fourier-transformed signals $IF_i(r)$ from the reception signals $I_i(k)$, wherein:

$$IF_i(r) = \rho(r) \cdot e^{i\Phi(r)} \cdot B1_i^-(r) + N$$

with N:=noise term, $\rho(r) \cdot e^{i\Phi(r)}$:=proton density;
determine complexly corrected signals $\tilde{I}F_i(r)$ on the basis of the signals $IF_i(r)$ and the individual reception sensitivity profiles $B1_i^-(r)$;
determine a sum signal MR(r) via complex addition of the corrected signals $\tilde{I}F_i(r)$ $$MR(r) = \sum_i \tilde{I}F_i(r);$$

reconstruct image data of the examination subject on the basis of the sum signal MR(r), and make the image data available at an output of the processor as an electronic data file; and
at a display monitor in communication with said processor, display an image, corresponding to said image data, of the examination subject.

* * * * *